(12) United States Patent
Kong (10) Patent No.: US 11,894,818 B2
(45) Date of Patent: Feb. 6, 2024

(54) QUANTUM PARAMETER AMPLIFIER

(71) Applicant: Origin Quantum Computing Technology (Hefei) Co., Ltd, Hefei (CN)

(72) Inventor: Weicheng Kong, Anhui (CN)

(73) Assignee: Origin Quantum Computing Technology (Hefei) Co., Ltd, Hefei (CN)

( * ) Notice: Subject to any disclaimer, the term of this patent is extended or adjusted under 35 U.S.C. 154(b) by 558 days.

(21) Appl. No.: 17/057,286

(22) PCT Filed: Mar. 20, 2020

(86) PCT No.: PCT/CN2020/080478
§ 371 (c)(1),
(2) Date: Nov. 20, 2020

(87) PCT Pub. No.: WO2020/253292
PCT Pub. Date: Dec. 24, 2020

(65) Prior Publication Data
US 2021/0265963 A1 Aug. 26, 2021

(30) Foreign Application Priority Data

Jun. 17, 2019 (CN) .......................... 201910522955.6
Jun. 17, 2019 (CN) .......................... 201910522965.X
(Continued)

(51) Int. Cl.
*H03F 7/02* (2006.01)
*G06N 10/00* (2022.01)
(Continued)

(52) U.S. Cl.
CPC ............... *H03F 7/02* (2013.01); *G06N 10/00* (2019.01); *H01P 7/06* (2013.01); *H03F 19/00* (2013.01); *H10N 60/805* (2023.02)

(58) Field of Classification Search
None
See application file for complete search history.

(56) References Cited

U.S. PATENT DOCUMENTS

2009/0153381 A1   6/2009   Kirichenko
2019/0229690 A1   7/2019   White et al.
2020/0333263 A1*  10/2020  Abdo ..................... G01N 22/00

FOREIGN PATENT DOCUMENTS

CN   108259014   7/2018
CN   109874327   6/2019
(Continued)

OTHER PUBLICATIONS

International Search Report from corresponding PCT Appln. No. PCT/CN2020/080478, dated Jun. 10, 2020. English translation attached.

*Primary Examiner* — Jas A Sanghera
(74) *Attorney, Agent, or Firm* — Westbridge IP LLC (57) ABSTRACT

A quantum parameter amplifier; the quantum parameter amplifier includes a capacitor module, a first microwave resonant cavity, and an inductance-adjustable superconducting quantum interference apparatus that are connected in sequence to constitute an oscillation amplifier circuit, wherein the superconducting quantum interference apparatus is grounded; the quantum parameter amplifier further includes a voltage modulating circuit and/or a second microwave resonant cavity; one end of the voltage modulating circuit is connected with an end of the superconducting quantum interference apparatus that is close to the first microwave resonant cavity; and one end of the second microwave resonant cavity is connected with the end of the superconducting quantum interference apparatus that is close to the first microwave resonant cavity. A frequency of a pump signal that makes the quantum parameter amplifier according to the present disclosure in an optimal operation (Continued)

mode does not need to be selected as a multiple of a frequency of the signal to be amplified.

17 Claims, 5 Drawing Sheets

(30) Foreign Application Priority Data

Jun. 17, 2019 (CN) .......................... 201910525439.9
Jun. 17, 2019 (CN) .......................... 201920907681.8
Jun. 17, 2019 (CN) .......................... 201920907708.3
Jun. 17, 2019 (CN) ......................... 201920908547.X (51) Int. Cl.
*H01P 7/06* (2006.01)
*H03F 19/00* (2006.01)
*H10N 60/80* (2023.01)

(56) References Cited

FOREIGN PATENT DOCUMENTS

| | | |
|---|---|---|
| CN | 110120792 | 8/2019 |
| CN | 110138352 | 8/2019 |
| CN | 110277969 | 9/2019 |
| JP | 2009225213 | 10/2009 |

* cited by examiner

QUANTUM PARAMETER AMPLIFIER

CROSS-REFERENCE TO RELATED APPLICATIONS

This is the U.S. National Phase Application under 35 U.S.C. § 371 of International Patent Application No. PCT/CN2020/062859 filed Mar. 20, 2020 which claims priority of Chinese Patent Application entitled "Quantum Parameter Amplifier" filed to the Patent Office of China on Jun. 17, 2019, with the Application No. CN201910522955.6, the disclosure of which is incorporated herein by reference in its entirety.

This application also claims priority of Chinese Patent Application entitled "Quantum Parameter Amplifier" filed to the Patent Office of China on Jun. 17, 2019, with the Application No. CN201910522965.X, the disclosure of which is incorporated herein by reference in its entirety.

This application also claims priority of Chinese Patent Application entitled "Quantum Parameter Amplifier" filed to the Patent Office of China on Jun. 17, 2019, with the Application No. CN201910525439.9, the disclosure of which is incorporated herein by reference in its entirety.

This application also claims priority of Chinese Patent Application entitled "Quantum Parameter Amplifier" filed to the Patent Office of China on Jun. 17, 2019, with the Application No. CN201920907681.8, the disclosure of which is incorporated herein by reference in its entirety.

This application also claims priority of Chinese Patent Application entitled "Quantum Parameter Amplifier" filed to the Patent Office of China on Jun. 17, 2019, with the Application No. CN201920908547.X, the disclosure of which is incorporated herein by reference in its entirety.

This application also claims priority of Chinese Patent Application entitled "Quantum Parameter Amplifier" filed to the Patent Office of China on Jun. 17, 2019, with the Application No. CN201920907708.3, the disclosure of which is incorporated herein by reference in its entirety.

FIELD

The present disclosure belongs to a field of signal amplifiers, and more particularly, to a quantum parameter amplifier.

BACKGROUND

In a field of quantum computing, in order to obtain an operation result of a quantum chip, there is a need to collect and analyze a signal output by the quantum chip, that is, a quantum bit read signal. A quantum bit read detecting signal is extremely weak; taking a superconducting quantum bit system as an example, the quantum bit read detecting signal is usually in a frequency band of 4 to 8 GHz, with power as low as −140 dBm or even below −150 dBm. Taking into account the coupling efficiency of a quantum bit detecting signal and a quantum bit reading detector, the power of −150 dBm to −140 dBm corresponds to about 1 to 10 photons inside the detector; such a weak detecting signal will further incur additional losses after being transmitted by the detector again. Therefore, one of major problems to be solved in the application of quantum chips is how to extract effective quantum state information from such a weak quantum bit read signal.

An oscillation amplifier circuit is a commonly used structure in the field of signal amplification, and is a key component of many electronic devices; the oscillation amplifier circuit usually takes the form of an LC oscillator circuit, including a capacitor and an inductor interconnected, and can not only be configured to generate a signal of a specific frequency, but also be configured to separate a signal of a specific frequency from more complex signals. The quantum bit read signal is a high-frequency signal with a very short wavelength; and the capacitor and inductor devices used in a traditional LC oscillator circuit have a relatively large-sized structure, and energy of the LC oscillator circuit is dispersed in a surrounding space at a pretty fast dissipating speed; so a quantum parameter amplifier applied in a quantum field has to be adopted.

The existing quantum parameter amplifier operates based on a nonlinear mixing principle; in order to effectively amplify the quantum bit read signal to make the quantum parameter amplifier operate in an optimal mode, it is necessary to additionally apply a pump signal whose frequency is close to a frequency of a signal to be amplified or to a multiple thereof; for example, application of a pump signal whose frequency is close to the frequency of the signal to be amplified corresponds to a four-wave mixing mode, and application of a pump signal whose frequency is close to twice the frequency of the signal to be amplified corresponds to a three-wave mixing mode.

When the frequency of the pump signal must be selected to be close to a multiple of the frequency of the signal to be amplified, there are irrelevant signals whose frequencies are extremely close to the frequency of the signal to be amplified in the signals output by the amplifier; these irrelevant signals are difficult to be eliminated by a wave filter because their frequencies are too close to that of the signal to be amplified; and they will interfere with a demodulation process of the quantum bit read signal, which will cause demodulation fidelity and demodulation efficiency of a quantum chip operation result to be greatly reduced. Therefore, when the quantum parameter amplifier is in an optimal operation mode, how to make the frequency of the pump signal need not to be selected as a multiple of the frequency of the signal to be amplified is an urgent problem for those skilled in the art.

SUMMARY

With respect to the above-described problems, the present disclosure provides a quantum parameter amplifier, so that the frequency of the pump signal that makes the quantum parameter amplifier in the optimal operation mode does not need to be selected as a multiple of the frequency of the signal to be amplified.

There is provided a quantum parameter amplifier, the quantum parameter amplifier including a capacitor module, a first microwave resonant cavity, and an inductance-adjustable superconducting quantum interference apparatus that are connected in sequence to constitute an oscillation amplifier circuit, wherein, the superconducting quantum interference apparatus is grounded; when a resonant frequency of the first microwave resonant cavity is equal to a frequency of a signal to be amplified, the signal to be amplified is coupled into the oscillation amplifier circuit from the capacitor module, and the oscillation amplifier circuit amplifies the signal to be amplified under an action of a pump signal, and generates idle frequency signals; and inductance of the superconducting quantum interference apparatus is adjusted so that the resonant frequency of the first microwave resonant cavity is equal to the frequency of the signal to be amplified.

The quantum parameter amplifier further includes a voltage modulating circuit and/or a second microwave resonant cavity, One end of the voltage modulating circuit is connected with an end of the superconducting quantum interference apparatus that is close to the first microwave resonant cavity; the voltage modulating circuit is configured to supply a bias voltage to the superconducting quantum interference apparatus; and the superconducting quantum interference apparatus releases at least one type of the idle frequency signals generated in the oscillation amplifier circuit under an action of the bias voltage;

One end of the second microwave resonant cavity is connected with an end of the superconducting quantum interference apparatus that is close to the first microwave resonant cavity; and a resonant frequency of the second microwave resonant cavity is equal to a frequency of one type of the idle frequency signals generated by the oscillation amplifier circuit.

The operation mode of the quantum parameter amplifier according to the present disclosure is no longer adjusted only by the pump signal, but is adjusted by the bias voltage supplied by the voltage modulating circuit or/and the resonant frequency of the second microwave resonant cavity as well as the pump signal together, so that the frequency of the pump signal that makes the quantum parameter amplifier in the optimal operation mode does not need to be selected as a multiple of the frequency of the signal to be amplified; when an appropriate pump signal is selected, every type of irrelevant signals generated in the quantum parameter amplifier may all maintain a frequency difference divisible by a wave filter from the signal to be amplified on a frequency spectrum, or be released, which further facilitates a post-stage wave filter to eliminate these irrelevant signals, and improves fidelity of the quantum parameter amplifier for reading the quantum bit read signal.

Other features and advantages of the present disclosure will be further explained in the following description, and partly become self-evident therefrom, or be understood through implementation of the present disclosure. The objectives and other advantages of the present disclosure will be achieved through the structure specifically pointed out in the description, claims, and the accompanying drawings.

BRIEF DESCRIPTION OF THE DRAWINGS

In order to clearly illustrate the technical solution of the embodiments of the present disclosure or in the prior art, the drawings that need to be used in description of the embodiments or the prior art will be briefly described in the following; it is obvious that the described drawings are only related to some embodiments of the present disclosure; based on the drawings, those ordinarily skilled in the art can acquire other drawings, without any inventive work.

In the diagrams: 100—capacitor module, 200—first microwave resonant cavity, 300—inductance-adjustable superconducting quantum interference apparatus, 310—superconducting quantum interferometer, 320—magnetic flux modulating circuit, 400—voltage modulating circuit, 500—second microwave resonant cavity, 600—wave filter, 700—circulator, 800—second capacitor module.

DETAILED DESCRIPTION

In order to make objectives, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those ordinarily skilled in the art can acquire other embodiment(s), without any inventive work, which should be within the scope of protection of the present disclosure.

Embodiment 1

Figure 1:
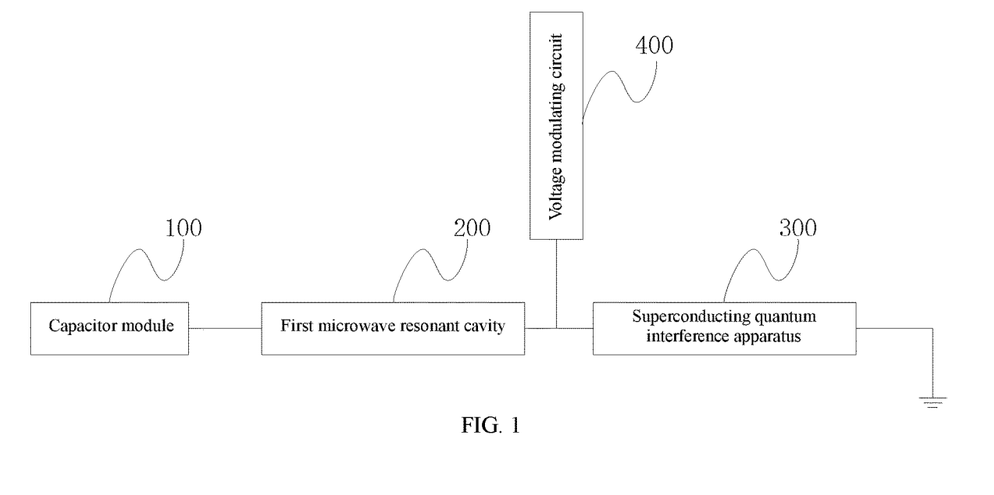
FIG. 1 is a structural schematic diagram of a quantum parameter amplifier according to Embodiment 1 of the present disclosure.
Figure 2:
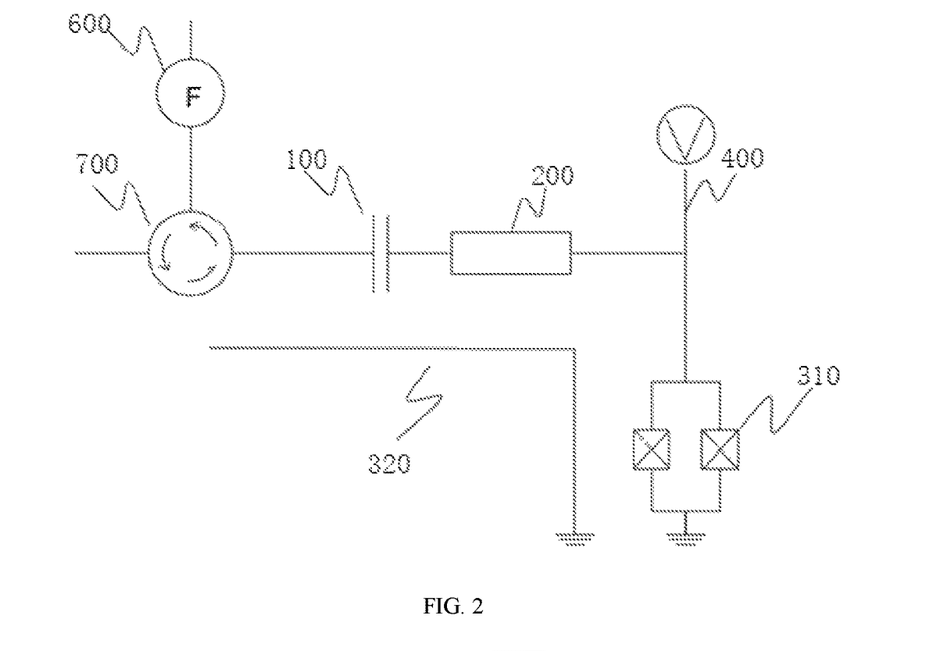
FIG. 2 is a circuit principle diagram of the quantum parameter amplifier according to Embodiment 1 of the present disclosure.

Referring to FIG. 1 and FIG. 2, this embodiment provides a quantum parameter amplifier, the quantum parameter amplifier including a capacitor module 100, a first microwave resonant cavity 200, and an inductance-adjustable superconducting quantum interference apparatus 300 that are connected in sequence to constitute an oscillation amplifier circuit. Wherein, the capacitor module 100, the first microwave resonant cavity 200 and the superconducting quantum interference apparatus 300 are connected in sequence, and the superconducting quantum interference apparatus 300 is grounded; inductance of the superconducting quantum interference apparatus 300 is adjusted to make a resonant frequency of the first microwave resonant cavity 200 equal to a frequency of the signal to be amplified, so that the signal to be amplified has an optimal resonant amplification effect in the first microwave resonant cavity 200. Wherein, the signal to be amplified is coupled into the oscillation amplifier circuit from the capacitor module 100, and the signal to be amplified and a pump signal perform nonlinear interaction in the first microwave resonant cavity 200, to further amplify the signal to be amplified. It should be noted that the pump signal is also coupled into the oscillation amplifier circuit from the capacitor module 100. After the signal to be amplified and the pump signal perform nonlinear interaction, output signals not only include an amplified signal, but also include various idle frequency signals, that is, the oscillation amplifier circuit amplifies the signal to be amplified under an action of the pump signal and generates several types of idle frequency signals.

It should be noted that, according to a nonlinear mixing principle, each type of the idle frequency signals satisfies a formula below:

$$mf_s + nf_i = lf_p$$

Where m, n, and l are positive integers, $f_s$ is the frequency of the signal to be amplified, $f_p$ is the frequency of the pump signal, $f_i$ is the frequency of the idle frequency signal; when the signal to be amplified and the pump signal are determined, different values are taken for m, n and l, and various idle frequency signals will be obtained.

It should be noted that, a basic principle of the quantum parameter amplifier is that: inductance generated by the inductance-adjustable superconducting quantum interference apparatus 300 is used to constitute an LC oscillator circuit with a capacitor, so as to construct a single-mode optical field in the microwave resonant cavity, at this time, the weak signal to be amplified and the pump signal enter the device together, the signal to be amplified is amplified in the microwave resonant cavity, and meanwhile, the entire process is in a superconducting state with almost no dissipation.

Wherein, it should be noted that the inductance-adjustable superconducting quantum interference apparatus 300 includes a superconducting quantum interferometer 310 and a magnetic flux modulating circuit 320 coupled by mutual inductance; the superconducting quantum interferometer is a closed-loop apparatus constituted by Josephson junctions connected in parallel, and is connected with the first microwave resonant cavity 200; and the magnetic flux modulating circuit 320 is configured to adjust inductance of the closed-loop apparatus. Wherein, the Josephson junction is generally constituted by two superconductors sandwiching a very thin barrier layer, for example, a superconductor (S)-semiconductor or insulator (I)-superconductor (S) structure, briefly referred to as SIS. The superconducting quantum interferometer 310 may be a closed-loop apparatus constituted by at least 2 Josephson junctions connected in parallel, and the number of Josephson junctions will not be limited in the present disclosure. In the SIS, a superconducting electron may tunnel from one side of one of the superconductors through the semiconductor or the insulator to the superconductor on the other side, which may be referred to as a Josephson effect; a current generated thereby is referred to as a Josephson current; and when a plurality of Josephson junctions are connected together to form a closed-loop apparatus, a Josephson interferometer is constituted, which may be referred to as a superconducting quantum interferometer. It can be seen that, the Josephson junction is a nonlinear inductor, and inductance thereof has a quantitative relationship with a path current. Therefore, the superconducting quantum interferometer constituted by the Josephson junctions connected in parallel may constitute an inductance-adjustable non-linear inductor, which is further configured to adjust the operation performance of the quantum parameter amplifier according to the present disclosure.

At present, multi-stage amplifiers are added to an output line of the quantum bit read signal to increase signal strength; and usually, a pre-stage amplifier adopts a quantum parameter amplifier. When the quantum parameter amplifier operates, an incidental noise is as low as a level close to a quantum limit, which is just an origin of the name thereof.

Assuming that the quantum bit read signal that finally leaves a quantum bit reading detector has 10 effective photons, they will enter a subsequent line and be mixed with thermal noises, electrical noises, etc. Wherein, a standard thermal noise satisfies thermodynamic distribution and may be converted into the number n of photons through $k_B T \cong nhf$, where $k_B$ in the above formula is Boltzmann's constant, T is the ambient noise temperature at frequency f, and h is Planck's constant. Assuming that a quantum chip is in a 10 mK temperature environment, according to the above formula, n is less than 0.1, which is negligible; however, a receiving system of the quantum bit read signal is at room temperature, n is about 1,000; and if the quantum bit read signal is transmitted out directly, it will be submerged in the noises. Therefore, it is necessary to use a parameter amplifier.

Any amplifier will additionally introduce a noise while amplifying an original signal. We usually perform measurement through equivalent temperature of the noise, that is, the noise; and the larger the index, the worse the noise. The amplifier will definitely deteriorate a signal-to-noise ratio; so the amplifier should be set to raise a gain of the amplifier as far as possible while controlling noise temperature of the amplifier. The noise temperature also satisfies $k_B T \cong nhf$, so we can convert the noise temperature into the number of noise photons of a frequency f. The signal-to-noise ratio may be described as a ratio of the number of signal photons to the number of noise photons.

At present, commercial amplifiers with optimal performance are low-noise amplifiers produced by LNF of Sweden, which may amplify signals in a frequency band of 4 to 8 GHz, with noise temperature of about 3 K. By this measure, the number of noise photons is about 10, so the maximum signal-to-noise ratio that may be obtained by a commercial amplifier is about 1. The optimal quantum parameter amplifier may reach a noise level of a standard quantum limit, that is, n=0.5. Usually, n fluctuates within 0.5 to 2. Therefore, by using the quantum parameter amplifier, the signal-to-noise ratio of the system may be increased by about 5 to 20 times.

Although the quantum parameter amplifier has solved the problem of extracting effective quantum state information from such a weak quantum bit read signal by greatly improving the signal-to-noise ratio, new problems have been brought about.

The quantum parameter amplifier according to this embodiment further includes a voltage modulating circuit 400; the voltage modulating circuit 400 is connected between the first microwave resonant cavity 200 and the superconducting quantum interference apparatus 300, that is, the voltage modulating circuit 400 is arranged at an end of the inductance-adjustable superconducting quantum interference apparatus 300 that is close to the first microwave resonant cavity 200, and is configured to supply a bias voltage to the superconducting quantum interference apparatus 300; and the superconducting quantum interference apparatus 300, under an action of the bias voltage supplied by the voltage modulating circuit 400, release at least one type of the idle frequency signals generated in the oscillation amplifier circuit.

An operating principle is as follows: when the bias voltage is applied across the superconducting quantum interference apparatus 300, a current passing through the Josephson junction in the superconducting quantum interference apparatus 300 is an alternating oscillating superconducting current, whose oscillating frequency (or referred to as a Josephson frequency) f will be proportional to the bias voltage V, so that the Josephson junction has an ability to radiate or absorb electromagnetic waves, which satisfies a relational expression below:

$$2 eV = hf$$

Where h is Planck's constant, and e is an electronic charge.

Since the superconducting quantum interference apparatus constituted by several Josephson junctions connected in parallel has the ability to absorb electromagnetic waves, when the bias voltage is applied to the inductance-adjustable superconducting quantum interference apparatus 300, a current Cooper pair on the Josephson junction will absorb energy of a microwave signal to tunnel through the Josephson junction and flow out into the ground; when an appropriate bias voltage is selected to make f in the relational expression 2 eV=hf equal to a frequency of one type of the idle frequency signals generated by the oscillation amplifier circuit, the idle frequency signal generated in the oscillation amplifier circuit will be completely absorbed, which is manifested as the idle frequency signal being released.

It should be noted that, the microwave resonant cavity can operate only by being connected with an external circuit to form a microwave system; oscillation can be established in the microwave resonant cavity only through excitation by a microwave signal in the external circuit; the oscillation in the microwave resonant cavity can be output to an external load only through coupling; and the coupling is usually established by using a capacitor module with the microwave resonant cavity. The capacitor module 100 according to this embodiment is configured to establish coupling between the outside and the microwave resonant cavity, and couple the signal to be amplified into the first resonant cavity 200 through the established coupling effect. When specifically implemented, the capacitor module 100 may be an interdigital capacitor, a distributed capacitor or a parallel capacitor; and a specific form of the capacitor module 100 will not be limited in the present disclosure.

In the quantum parameter amplifier according to this embodiment, the signal to be amplified and the pump signal are coupled into the first microwave resonant cavity 200; the signal to be amplified will be amplified under the action of the pump signal; the inductance of the superconducting quantum interferometer 310 is adjusted to make an operating resonant frequency of the first microwave resonant cavity 200 consistent with the frequency of the signal to be amplified, so that the signal to be amplified has the optimal resonant amplification effect in the first microwave resonant cavity 200. It should be noted that, the output signals not only include the amplified signal, but also include the pump signal, a half-frequency pump signal, multiple-frequency pump signals, and various idle frequency signals. At this time, when an appropriate bias voltage V is applied to make a relevant physical quantity satisfies the relational expression 2 eV=hf, where f is equal to a frequency of a certain type of idle frequency signal, the idle frequency signal generated in the oscillation amplifier circuit will be completely absorbed, so that the pump signal frequency $f_p$ that makes the quantum parameter amplifier in the optimal operation mode does not need to be selected as a multiple of the signal to be amplified. When the selected pump signal frequency has a frequency difference divisible by the wave filter from the frequency of the signal to be amplified, each type of the idle frequency signals output also has a distance divisible by the wave filter from the signal to be amplified.

It should be noted that, before operation of the quantum parameter amplifier according to this embodiment, various parameters need to be designed, including selecting the magnitude of the bias voltage and the frequency of the pump signal; one of ultimate objectives of the present disclosure is that none of the idle frequency signals in the output irrelevant signals will cause interference to the signal to be amplified, that is, to make them divisible by the wave filter; here a specific example is provided, when the frequency of the signal to be amplified is 4 GHz, firstly the frequency one type of the idle frequency signals may be designed as 2 GHz, the bias voltage is calculated through the relational expression 2 eV=hf, and then one of possible pump signal frequencies is calculated according to the formula $mf_s+nf_i=lf_p$, for example, when m, n, and l are all 1, the pump signal frequency is selected as 6 GHz, at this time, other possible idle frequency signals are determined according to the frequency of the signal to be amplified, the pump signal frequency and the formula $mf_s+nf_i=lf_p$; it may be proved that, when different integer values are taken for m, n and l, none of the obtained idle frequency signals will cause interference to the signal to be amplified. Table 1 shows 8 types of idle frequency signals whose frequencies are closest to the frequency of the signal to be amplified when the frequency of the signal to be amplified is 4 GHz and the pump signal frequency is 6 GHz.

TABLE 1

| 8 types of idle frequency signals | | | | | | | | |
|---|---|---|---|---|---|---|---|---|
| m | 1 | 1 | 1 | 1 | −1 | −1 | −1 | −1 |
| l | 1 | 1 | −1 | −1 | 1 | 1 | −1 | −1 |
| n | 1 | −1 | 1 | −1 | 1 | −1 | 1 | −1 |
| $f_i$ | 2 GHz | 10 GHz | −10 Ghz | −2 GHz | −2 GHz | 10 GHz | −10 GHz | 2 GHz |

It can be seen from Table 1 that, the generated 8 types of idle frequency signals whose frequencies are closest to the frequency of the signal to be amplified all maintain a certain frequency difference from the signal to be amplified, so other idle frequency signals generated thereby will not cause interference to the signal to be amplified.

The traditional quantum parameter amplifier also has another problem: when the actual quantum chip operates, a large number of quantum bit signals need be simultaneously read out; quantum state information of each quantum bit is carried out by an independent signal, and a frequency thereof is different from a frequency of a signal carrying quantum state information of other quantum bit. Simultaneously reading a plurality of quantum bits means that there are simultaneously a plurality of signals to be amplified carrying information, which need to pass through the quantum parameter amplifier. Each signal therein will generate a large number of irrelevant signals while getting the amplification effect, and at least one irrelevant signal therein is close to the signal to be amplified itself. Besides, an irrelevant signal generated by a certain signal to be amplified is likely to have a frequency additionally close to a frequency of another signal to be amplified.

Specifically, for example: frequencies of signals to be amplified input to the traditional quantum parameter amplifier are respectively 6.4 GHz and 6.58 GHz (with a distance of 0.18 GHz, which is divisible by the wave filter); the pump signal frequency $f_p$ of the traditional quantum parameter amplifier may be designed as 6.5 GHz, corresponding to the four-wave mixing mode; then according to the formula $mf_s+nf_i=lf_p$, the frequency of one of the idle frequency signals of the amplified signal whose frequency is 6.4 GHz is 6.6 GHz, which will affect the 6.58 GHz signal (with a distance of 0.02 GHz, which is hardly divisible).

When the quantum parameter amplifier according to the present disclosure is adopted, by designing an idle frequency signal as, for example, 4 GHz, and designing the pump signal $f_p$ as 5.2 GHz and a corresponding bias voltage according to the 4 GHz signal and the 6.4 GHz amplified signal $f_s$, it can be known that, according to signal mixing effects of the 5.2 GHz pump signal $f_p$ respectively with the amplified signals $f_s$ of 6.4 GHz and 6.58 GHz, all the idle frequency signals $f_i$ obtained maintain a divisible frequency difference from the amplified signals $f_s$ of 6.4 GHz and 6.58 GHz.

In summary, as compared with the prior art, the operation mode of the quantum parameter amplifier according to this embodiment is no longer adjusted by only the pump signal, but is adjusted by the bias voltage supplied by the voltage modulating circuit 400 and the pump signal together; when the appropriate bias voltage and pump signal are selected, every type of irrelevant signals generated in the quantum parameter amplifier may maintain a frequency difference divisible by the wave filter from the signal to be amplified on a frequency spectrum, which may further eliminate these irrelevant signals, and improve fidelity of the quantum parameter amplifier for reading the quantum bit read signal.

It should be noted that, the pump signal for amplifying the signal to be amplified may also be coupled into the oscillation amplifier circuit from the magnetic flux modulating circuit 320.

Wherein, the magnetic flux modulating circuit 320 includes a magnetic flux modulating line and a current apparatus connected in sequence; the current apparatus is configured to generate a bias current; the magnetic flux modulating line is configured to transmit the bias current; and the bias current is used to adjust inductance of the superconducting quantum interferometer 310. Specifically, bias currents of different magnitudes generate magnetic fields of different magnitudes, so the magnetic flux passing through the superconducting quantum interferometer will also change with the magnitude of the bias current, the magnetic flux of the superconducting quantum interferometer changes, and further the inductance of the superconducting quantum interferometer changes accordingly.

It should be noted that, the current apparatus for generating the bias current may be a current source, or a voltage source and a resistor connected in sequence that may supply the bias current; and a specific form of the current source will not be limited in the present disclosure.

Specifically, in order to filter out the irrelevant signals other than the amplified signal in the output signals, the quantum parameter amplifier is further provided with a wave filter 600 at an output end of the oscillation amplifier circuit. Wherein, the irrelevant signals mainly refer to the pump signal, the half-frequency pump signal, multiple-frequency pump signals, and various idle frequency signals.

It should be noted that, the first microwave resonant cavity 200 according to this embodiment is a reflective microwave resonant cavity. Specifically, the reflective microwave resonant cavity is a coplanar waveguide microwave resonant cavity whose length is (2k+1) times a quarter of a wavelength of the signal to be amplified, where k is an integer≥0, and a signal whose frequency is equal to the frequency of the signal to be amplified may form a spatial standing wave structure in the coplanar waveguide microwave resonant cavity. When k=0, the length of the reflective microwave resonant cavity is a quarter of the wavelength of the signal to be amplified.

Because the reflective microwave resonant cavity, that is, the coplanar waveguide microwave resonant cavity whose length is (2k+1) times a quarter of the wavelength of the signal to be amplified has electric field distribution at two ports as follows: one port is a wave node, that is, a location with weakest electric field intensity distribution, and the other port is an wave loop, that is, a location with strongest electric field intensity distribution; the port with strongest electric field intensity distribution has a strongest electromagnetic signal coupling transmission ability; and in order to reduce signal transmission loss to guarantee signal transmission, with respect to the reflective microwave resonant cavity, the signal to be amplified enters or leaves from the same port of the reflective microwave resonant cavity, that is, the wave loop.

In this embodiment, it is set that the coplanar waveguide microwave resonant cavity whose length is a quarter of the wavelength of the signal to be amplified has the location with strongest electric field intensity distribution located at an end close to the capacitor module 100, and the location with weakest electric field intensity distribution located at an end close to the superconducting quantum interference apparatus 300; and an output signal will be output from the location with strongest electric field intensity distribution, that is, the end close to the capacitor module 100.

The voltage modulating circuit 400 is arranged at the end of the superconducting quantum interference apparatus 300 that is close to the first microwave resonant cavity 200, that is, the voltage modulating circuit 400 is connected at the location where the electric field of the reflective microwave resonant cavity is the weakest; and the direct-current bias voltage output by the voltage modulating circuit 400 hardly affects the microwave signal in the reflective microwave resonant cavity.

It should be noted that, in a microwave field, a coplanar waveguide is constituted by three parallel metal thin film conducting band layers prepared on a surface of a dielectric layer, in which the conduction band layer in the middle is configured to transmit microwave signals, and the conduction band layers on both sides are both connected with a ground plane; the greatest difference from a general circuit is that: the coplanar waveguide is a distributed circuit element, whose capacitance/inductance/immittance/impedance is evenly distributed along a signal propagation direction of the coplanar waveguide; what the coplanar waveguide transmits is a Transverse Electromagnetic (TEM) wave; and along the signal propagation direction, impedance of the waveguide is equal everywhere, so there is no signal reflection, and the signal can pass almost losslessly; in addition, the coplanar waveguide has no cutoff frequency, while common lumped circuits all have a cutoff frequency. With respect to a section of uniform coplanar waveguide, microwave signals in most frequency bands can be transmitted unimpeded, so it is also referred to as a transmitting line, that is, a coplanar waveguide transmitting line. When the designed coplanar waveguide transmitting line has a certain length, and both ends of the coplanar waveguide transmitting line each have a capacitive node constructed, the microwave signal is reflected after encountering the node, and resonance is formed in this section of the transmitting line.

Wherein, the magnetic flux modulating line for transmitting the bias current may also use a coplanar waveguide transmitting line.

Since the amplified signal will be output from the side of the reflective microwave resonant cavity that is close to the capacitor module 100 via the capacitor module 100, in order to isolate the input signal to be amplified from the output signal, the quantum parameter amplifier further includes a circulator 700; the circulator 700 is arranged at an end of the capacitor module 100 that is away from the reflective microwave resonant cavity; and the wave filter 600 is arranged at a signal output end of the circulator 700, that is, the signal output end of the circulator 700 is the output end of the oscillation amplifier circuit.

Embodiment 2

Figure 3:
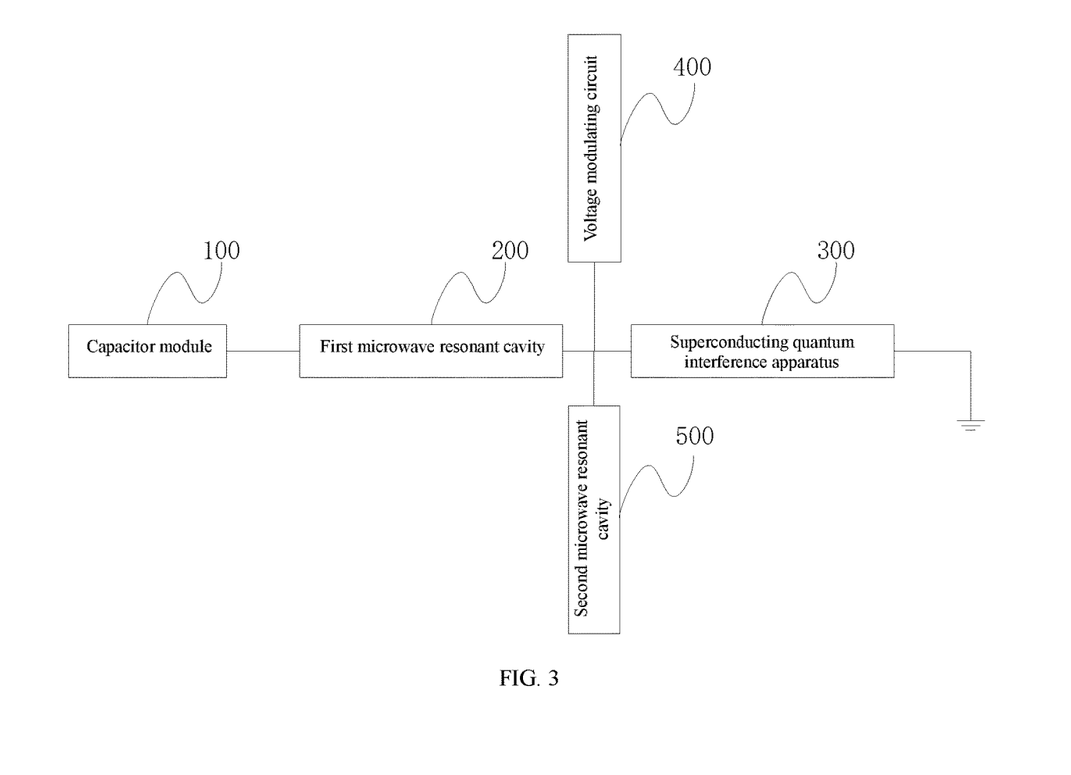
FIG. 3 is a structural schematic diagram of a quantum parameter amplifier according to Embodiment 2 of the present disclosure.
Figure 4:
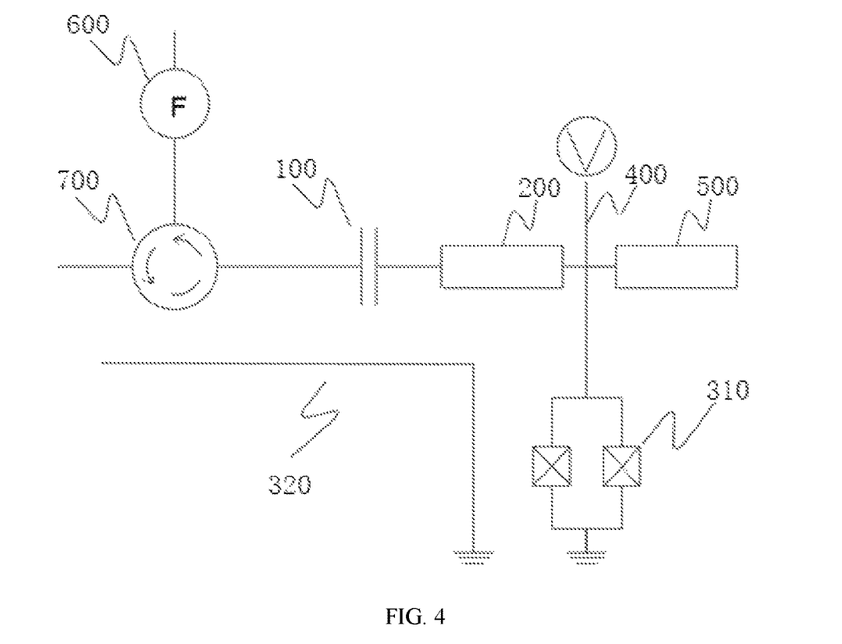
FIG. 4 is a circuit principle diagram of the quantum parameter amplifier according to Embodiment 2 of the present disclosure.

Referring to FIG. 3 and FIG. 4, the basic technical solution of this embodiment is the same as that of Embodiment 1; a difference from Embodiment 1 is that the quantum parameter amplifier according to this embodiment further includes a second microwave resonant cavity 500; the second microwave resonant cavity 500 is arranged at the end of the superconducting quantum interference apparatus 300 that is close to the first microwave resonant cavity 200; and a resonant frequency of the second microwave resonant cavity 500 is equal to a frequency of one type of the idle frequency signals generated by the oscillation amplifier circuit. Inductance of the superconducting quantum interference apparatus 300 is adjusted to make an operating frequency of the first microwave resonant cavity 200 equal to the frequency of the signal to be amplified, so that the signal to be amplified has an optimal resonant amplification effect in the first microwave resonant cavity 200. The signal to be amplified is coupled into the oscillation amplifier circuit from the capacitor module 100, and the signal to be amplified and the pump signal perform nonlinear interaction in the first microwave resonant cavity 200, to further amplify the signal to be amplified. It should be noted that, the pump signal is also coupled into the oscillation amplifier circuit from the capacitor module 100. After the signal s to be amplified and the pump signal perform nonlinear interaction, output signals not only include an amplified signal, but also include various idle frequency signals i, that is, the oscillation amplifier circuit amplifies the signal to be amplified under an action of the pump signal and generates several types of idle frequency signals It should be noted that, according to a nonlinear mixing principle, each type of the idle frequency signals satisfies a formula below:

$$mf_s + nf_i = lf_p$$

Where m, n, and l are positive integers, $f_s$ is the frequency of the signal to be amplified, $f_p$ is the frequency of the pump signal, $f_i$ is the frequency of the idle frequency signal; when the signal to be amplified and the pump signal are determined, different values are taken for m, n and l, and various idle frequency signals will be obtained.

The quantum parameter amplifier according to this embodiment is provided with the second microwave resonant cavity 500, so that a portion of energy of the pump signal may be converted into one type of idle frequency signals whose frequency is equal to the resonant frequency of the second microwave resonant cavity 500; and when an appropriate resonant frequency of the second microwave resonant cavity 500 is selected and then the pump signal is selected through the resonant frequency of the second microwave resonant cavity 500, one type of the idle frequency signals generated in the quantum parameter amplifier whose frequency is equal to the resonant frequency of the second microwave resonant cavity 500 may be released.

It should be noted that, when the bias voltage applied by the voltage modulating circuit 400 makes the frequency of the idle frequency signal released by the inductance-adjustable superconducting quantum interference apparatus 300 equal to the resonant frequency of the second microwave resonant cavity 500, the idle frequency signal flows out into the ground through the second microwave resonant cavity 500 and the superconducting quantum interference apparatus 300, which optimizes a release effect of the idle frequency signal.

Wherein, the end of the second microwave resonant cavity 500 that is away from the first microwave resonant cavity 200 may also be grounded; by such setting, the idle frequency signal may also flow out through the ground. At this time, the pump signal frequency $f_p$ that makes the quantum parameter amplifier in the optimal operation mode does not need to be selected as the multiple of the frequency of the signal to be amplified; when the selected pump signal frequency $f_p$ has a frequency difference divisible by the wave filter from the frequency of the signal to be amplified, each type of the idle frequency signals i output also has a frequency difference divisible by the wave filter from the signal to be amplified, that is, all other irrelevant signals except the idle frequency signal released may maintain a frequency difference divisible by the wave filter from the signal to be amplified on a frequency spectrum, which may further eliminate these irrelevant signals and improve fidelity of the quantum parameter amplifier for reading the quantum bit read signal.

Embodiment 3

Figure 5:
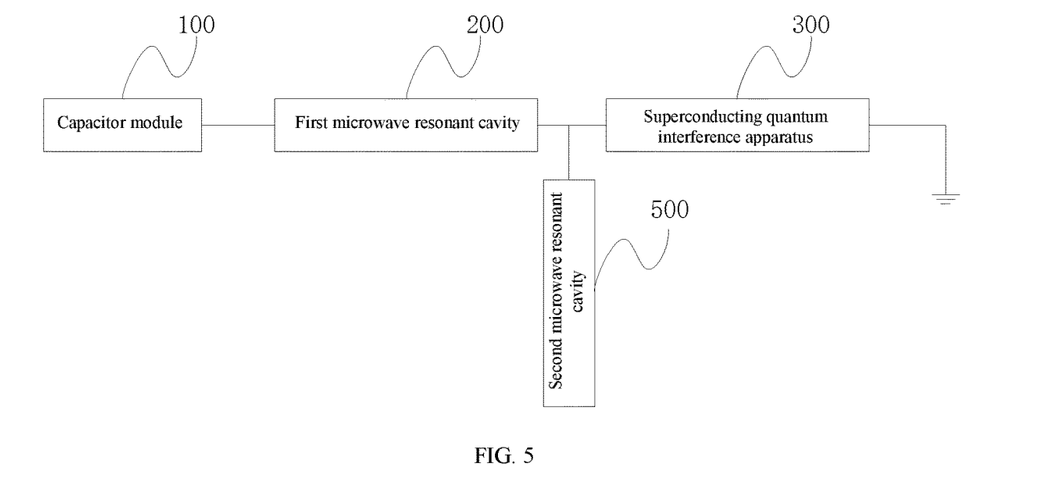
FIG. 5 is a structural schematic diagram of a quantum parameter amplifier according to Embodiment 3 of the present disclosure.
Figure 6:
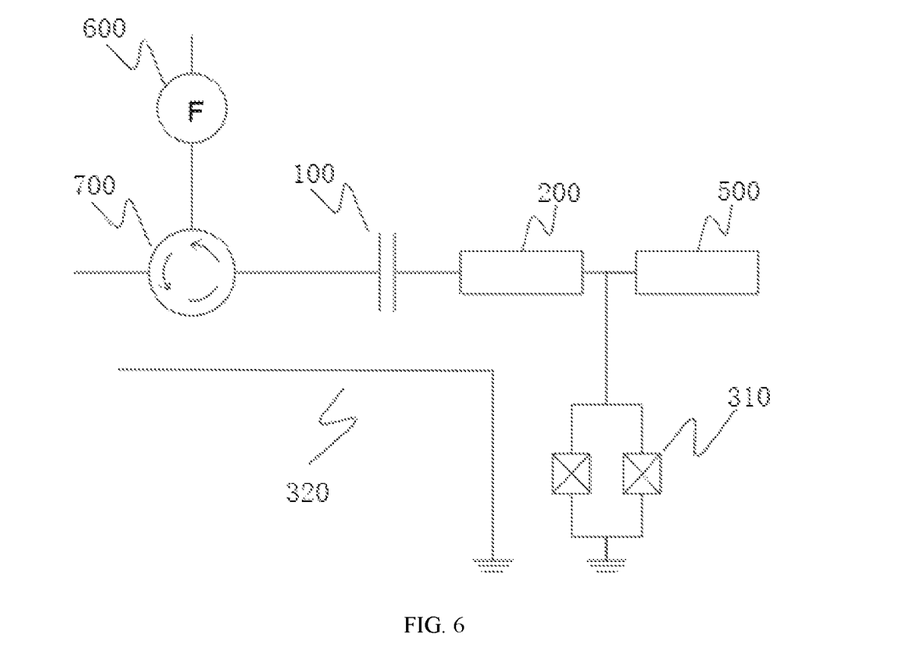
FIG. 6 is a circuit principle diagram of the quantum parameter amplifier according to Embodiment 3 of the present disclosure.

Referring to FIG. 5 and FIG. 6, this embodiment provides a quantum parameter amplifier, the quantum parameter amplifier including a capacitor module 100, a first microwave resonant cavity 200, and an inductance-adjustable superconducting quantum interference apparatus 300 that are connected in sequence to constitute an oscillation amplifier circuit. Wherein, the capacitor module 100, the first microwave resonant cavity 200 and the superconducting quantum interference apparatus 300 are connected in sequence, and the superconducting quantum interference apparatus is grounded; inductance of the superconducting quantum interference apparatus 300 is adjusted to make a resonant frequency of the first microwave resonant cavity 200 equal to a frequency of a signal to be amplified, so that the signal to be amplified has an optimal resonant amplification effect in the first microwave resonant cavity 200. The signal to be amplified is coupled into the oscillation amplifier circuit from the capacitor module 100, and the signal to be amplified and a pump signal perform nonlinear interaction in the first microwave resonant cavity 200, to further amplify the signal to be amplified. It should be noted that, the pump signal is also coupled into the oscillation amplifier circuit from the capacitor module 100. After the signal to be amplified and the pump signal perform nonlinear interaction, output signals not only include an amplified signal, but also include various idle frequency signals, that is, the oscillation amplifier circuit amplifies the signal to be amplified under an action of the pump signal and generates several types of idle frequency signals.

It should be noted that, according to a nonlinear mixing principle, each type of the idle frequency signals satisfies a formula below:

$$mf_s + nf_i = lf_p$$

Where m, n, and l are positive integers, $f_s$ is the frequency of the signal to be amplified, $f_p$ is a frequency of the pump signal, $f_i$ is a frequency of the idle frequency signal; when the signal to be amplified and the pump signal are determined, different values are taken for m, n and l, and various idle frequency signals will be obtained.

The quantum parameter amplifier according to this embodiment further includes a second microwave resonant cavity 500; the second microwave resonant cavity 500 is arranged at an end of the inductance-adjustable superconducting quantum interference apparatus 300 that is close to the first microwave resonant cavity 200; and a resonant frequency of the second microwave resonant cavity 500 is equal to a frequency of one type of the idle frequency signals generated by the oscillation amplifier circuit, so that one type of the idle frequency signals generated in the oscillation amplifier circuit whose frequency is equal to the resonant frequency of the second microwave resonant cavity 500 may be released.

It should be noted that, usually the microwave resonant cavity can operate only by being connected with an external circuit to form a microwave system; oscillation can be established in the cavity only through excitation by a microwave signal in the external circuit; the oscillation in the cavity can be output to an external load only through coupling; and the coupling is usually established by using a capacitor module with the microwave resonant cavity. The capacitor module 100 according to this embodiment is configured to establish coupling between the outside and the microwave resonant cavity, and couple the signal to be amplified into the first resonant cavity 200 through the established coupling effect. When specifically implemented, the capacitor module 100 may be an interdigital capacitor, a distributed capacitor or a parallel capacitor; and an interdigital capacitor, a distributed capacitor and a parallel-plate capacitor device of a same size have a capacitance value difference of several orders of magnitude. When designing the quantum parameter amplifier, a choice may be made from the three types of capacitors according to actual needs. Therefore, a specific form of the capacitor module 100 will not be limited in the present disclosure.

The quantum parameter amplifier according to this embodiment is provided with the second microwave resonant cavity 500, so that a portion of energy of the pump signal may be converted into one type of idle frequency signals whose frequency is equal to the resonant frequency of the second microwave resonant cavity 500; when an appropriate resonant frequency $f_2$ of the second microwave resonant cavity 500 is selected, that is $f_2=f_i$, according to $mf_s+nf_i=lf_p$, a relational expression $mf_s+nf_2=lf_p$ may be obtained; selecting an appropriate pump signal frequency $f_p$ is just selecting the pump signal through the resonant frequency of the second microwave resonant cavity 500, so that one type of the idle frequency signals generated in the quantum parameter amplifier whose frequency is equal to the resonant frequency of the second microwave resonant cavity 500 may be released. At this time, the pump signal frequency $f_p$ that makes the quantum parameter amplifier in the optimal operation mode does not have to be selected as a multiple of the frequency of the signal to be amplified; when the selected pump signal frequency $f_p$ has a frequency difference divisible by the wave filter from the frequency of the signal to be amplified, each type of the idle frequency signals output also has a frequency difference divisible by the wave filter with the signal to be amplified, that is, all other irrelevant signals except the idle frequency signal released may maintain a frequency difference divisible by the wave filter from the signal to be amplified on a frequency spectrum, which may further eliminate these irrelevant signals and improve fidelity of the quantum parameter amplifier for reading the quantum bit read signal.

It should be noted that, before operation of the quantum parameter amplifier according to this embodiment, various parameters need to be designed; one of ultimate objectives of the present disclosure is that none of the idle frequency signals in the output irrelevant signals will cause interference to the signal to be amplified, that is, to make them divisible by the wave filter; here a specific example is provided, when the frequency of the signal to be amplified is 4 GHz, firstly the frequency of one type of the idle frequency signals may be designed as 2 GHz, the resonant frequency $f_2$ of the second microwave resonant cavity 300 is determined as 2 GHz according to the idle frequency signal; through the relational expression $mf_s+nf_2=lf_p$, let m=n=l=1, and the appropriate pump signal frequency $f_p$ is selected as 6 GHz; at this time, other possible idle frequency signals are determined according to the frequency of the signal to be amplified, the pump signal frequency and the formula $mf_s+nf_i=lf_p$; it may be proved that, when different values are taken for m, n and l, none of the obtained idle frequency signals will cause interference to the signal to be amplified. Table 2 shows 8 types of idle frequency signals whose frequencies are closest to the frequency of the signal to be amplified when the frequency of the signal to be amplified is 4 GHz and the pump signal frequency is 6 GHz.

TABLE 2

| 8 types of idle frequency signals | | | | | | | | |
|---|---|---|---|---|---|---|---|---|
| m | 1 | 1 | 1 | 1 | −1 | −1 | −1 | −1 |
| l | 1 | 1 | −1 | −1 | 1 | 1 | −1 | −1 |
| n | 1 | −1 | 1 | −1 | 1 | −1 | 1 | −1 |
| $f_i$ | 2 GHz | 10 GHz | −10 Ghz | −2 GHz | −2 GHz | 10 GHz | −10 GHz | 2 GHz |

It can be seen from Table 2 that, the generated 8 types of idle frequency signals whose frequencies are closest to the frequency of the signal to be amplified all maintain a certain frequency difference from the signal to be amplified, so other idle frequency signals generated thereby will not cause interference to the signal to be amplified.

The traditional quantum parameter amplifier also has another problem: when the actual quantum chip operates, a large number of quantum bit signals need be simultaneously read out; quantum state information of each quantum bit is carried out by an independent signal, and a frequency thereof is different from a frequency of a signal carrying quantum state information of other quantum bit. Simultaneously reading a plurality of quantum bits means that there are simultaneously a plurality of signals to be amplified carrying information, which need to pass through the quantum parameter amplifier. Each signal therein will generate a large number of irrelevant signals while getting the amplification effect, and at least one irrelevant signal therein is close to the signal to be amplified itself. Besides, an irrelevant signal generated by a certain signal to be amplified is likely to have a frequency additionally close to a frequency of another signal to be amplified.

Specifically, for example: frequencies of signals to be amplified input to the traditional quantum parameter amplifier are respectively 6.4 GHz and 6.58 GHz (with a distance of 0.18 GHz, which is divisible by the wave filter); the pump signal frequency of the traditional quantum parameter amplifier may be designed as 6.5 GHz, corresponding to the four-wave mixing mode; then according to the formula $mf_s+nf_i=lf_p$, the frequency of one of the idle frequency signals of the amplified signal whose frequency is 6.4 GHz is 6.6 GHz, which will affect the 6.58 GHz signal (a distance there between is 0.02 GHz, which is hardly divisible).

When the quantum parameter amplifier according to the present disclosure is adopted, by designing an idle frequency signal as, for example, 4 GHz, the resonant frequency $f_2$ of the second microwave resonant cavity 300 is determined as 4 GHz according to the idle frequency signal; and according to the 4 GHz signal and the 6.4 GHz amplified signal, the frequency of the pump signal is designed as 5.2 GHz; it can be known that, according to signal mixing effects of the 5.2 GHz pump signal respectively with the amplified signals of 6.4 GHz and 6.58 GHz, all the idle frequency signals obtained maintain a divisible frequency difference from the amplified signals of 6.4 GHz and 6.58 GHz.

In summary, as compared with the prior art, the operation mode of the quantum parameter amplifier according to this embodiment is no longer adjusted by only the pump signal, but is adjusted by the resonant frequency of the second microwave resonant cavity and the pump signal together, so that a portion of energy of the pump signal may be converted into one type of idle frequency signals whose frequency is equal to the resonant frequency of the second microwave resonant cavity 500; and when an appropriate resonant frequency of the second microwave resonant cavity 500 is selected and then the pump signal is selected through the resonant frequency of the second microwave resonant cavity 500, one type of the idle frequency signals generated in the quantum parameter amplifier whose frequency is equal to the resonant frequency of the second microwave resonant cavity 500 may be released; and all other irrelevant signals except the idle frequency signal released may maintain a distance divisible by the wave filter from the signal to be amplified on a frequency spectrum, which may further eliminate these irrelevant signals and improve fidelity of the quantum parameter amplifier for reading the quantum bit read signal.

Wherein, the superconducting quantum interference apparatus 300 according to this embodiment includes a superconducting quantum interferometer 310 and a magnetic flux modulating circuit 320 coupled by mutual inductance; the superconducting quantum interferometer 310 is a closed-loop apparatus constituted by Josephson junctions connected in parallel; and the magnetic flux modulating circuit 320 is configured to adjust magnetic flux of the closed-loop apparatus, to adjust inductance of the closed-loop apparatus, and further adjust the inductance of the superconducting quantum interferometer 310. Wherein, the superconducting quantum interferometer 310 is connected with the first microwave resonant cavity 200; and the magnetic flux modulating circuit 320 and the superconducting quantum interferometer 310 are coupled by mutual inductance. Specifically, the superconducting quantum interferometer 310 used in this embodiment may be a closed-loop apparatus constituted by 2 Josephson junctions connected in parallel, and the number of Josephson junctions will not be limited in the present disclosure.

It should be noted that, the pump signal for amplifying the signal to be amplified may also be coupled into the oscillation amplifier circuit from the magnetic flux modulating circuit 320.

Wherein, the magnetic flux modulating circuit 320 includes a magnetic flux modulating line and a current apparatus connected in sequence; the current apparatus is configured to generate a bias current; the magnetic flux modulating line is configured to transmit the bias current; and the bias current is used to adjust the inductance of the superconducting quantum interferometer 310. Specifically, bias currents of different magnitudes generate magnetic fields of different magnitudes, so the magnetic flux passing through the superconducting quantum interferometer 310 will also change with the magnitude of the bias current, the magnetic flux of the superconducting quantum interferometer changes, and further the inductance of the superconducting quantum interferometer changes accordingly.

It should be noted that, the current apparatus for generating the bias current may be a current source, or a voltage source and a resistor connected in sequence that may supply the bias current; and a specific form of the current source will not be limited in the present disclosure.

Specifically, in order to filter out the irrelevant signals other than the amplified signal in the output signals, the quantum parameter amplifier is further provided with the wave filter 600 at an output end of the oscillation amplifier circuit. Wherein, the irrelevant signals mainly refer to the pump signal, the half-frequency pump signal, multiple-frequency pump signals, and various idle frequency signals.

It should be noted that, the first microwave resonant cavity 200 according to this embodiment is a reflective microwave resonant cavity. Specifically, the reflective microwave resonant cavity is a coplanar waveguide microwave resonant cavity whose length is (2k+1) times a quarter of the wavelength of the signal to be amplified, where k is a positive integer≥0; and when k=0, the length of the reflective microwave resonant cavity is a quarter of the wavelength of the signal to be amplified.

Because the reflective microwave resonant cavity, that is, the coplanar waveguide microwave resonant cavity whose length is (2k+1) times a quarter of the wavelength of the signal to be amplified has electric field distribution at two ports as follows: one port is a wave node, that is, a location with weakest electric field intensity distribution, and the other port is a wave loop, that is, a location with strongest electric field intensity distribution; the port with strongest electric field intensity distribution has strongest electromagnetic signal coupling transmission ability; and in order to reduce signal transmission loss to guarantee signal transmission, with respect to the reflective microwave resonant cavity, the signal to be amplified enters or leaves from the same port of the reflective microwave resonant cavity, that is, the wave loop.

In this embodiment, it is set that the coplanar waveguide microwave resonant cavity whose length is a quarter of the wavelength of the signal to be amplified has the location with a strongest electric field, that is, the wave loop, located at an end close to the capacitor module 100, and the location with a weakest electric field, that is, the wave node, located at an end close to the superconducting quantum interference apparatus 300; and an output signal will be output from the location with strongest signal coupling, that is, the end close to the capacitor module 100.

It should be noted that the coplanar waveguide according to this embodiment is the same as those according to the other embodiments as described above, the magnetic flux modulating line for transmitting the bias current may also use a coplanar waveguide transmitting line, and no details will be repeated here.

Since the amplified signal will be output from the side of the reflective microwave resonant cavity that is close to the capacitor module 100 via the capacitor module 100, in order to isolate the input signal to be amplified from the output signal, the quantum parameter amplifier further includes a circulator 700; the circulator 700 is arranged at an end of the capacitor module 100 that is away from the reflective microwave resonant cavity; and the wave filter 600 is arranged at a signal output end of the circulator 700, that is, the signal output end of the circulator 700 is the output end of the oscillation amplifier circuit.

Embodiment 4

Figure 7:
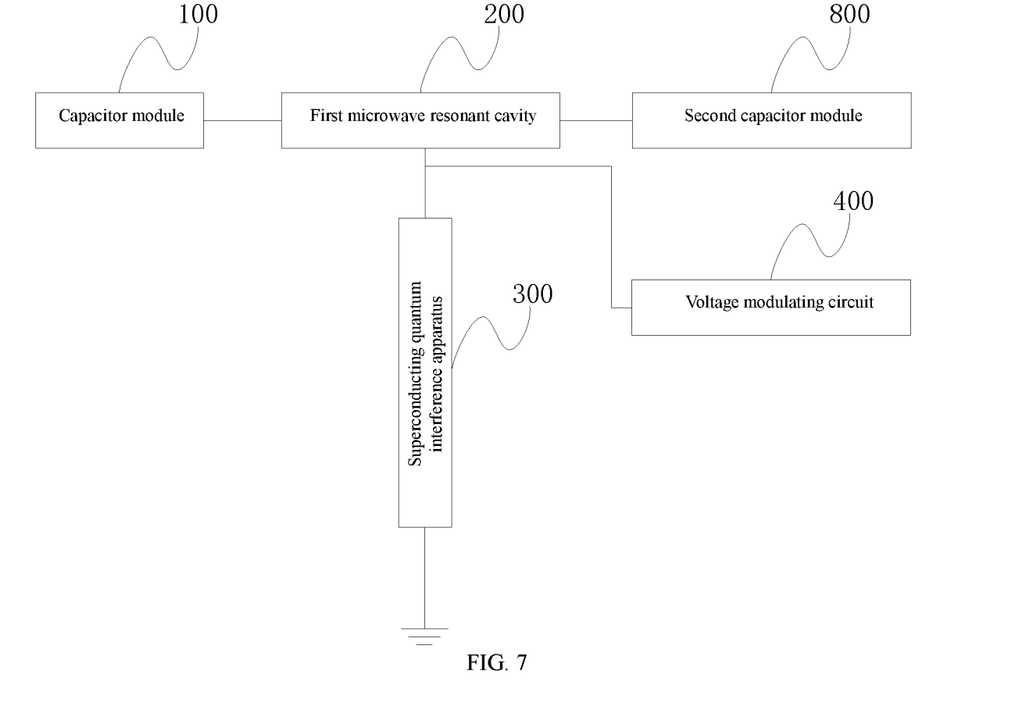
FIG. 7 is a structural schematic diagram of a quantum parameter amplifier according to Embodiment 4 of the present disclosure.
Figure 8:
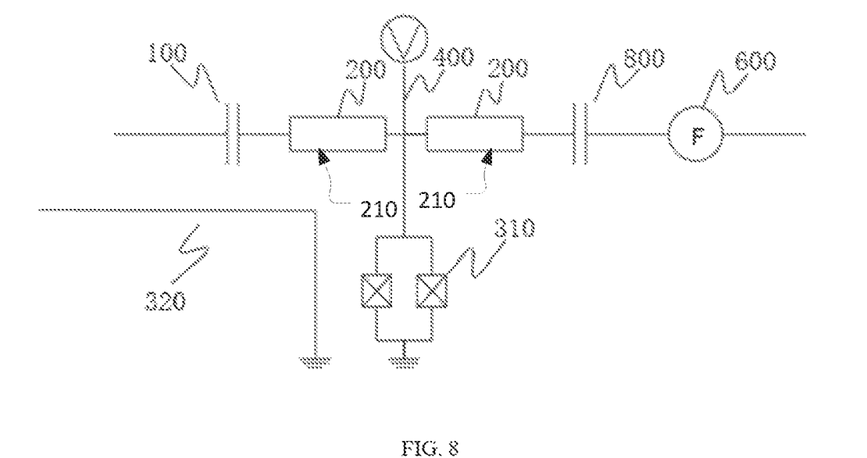
FIG. 8 is a circuit principle diagram of the quantum parameter amplifier according to Embodiment 4 of the present disclosure.

Referring to FIG. 7 and FIG. 8, this embodiment provides a quantum parameter amplifier, the quantum parameter amplifier including a capacitor module 100, a first microwave resonant cavity 200, and an inductance-adjustable superconducting quantum interference apparatus 300 that are connected in sequence to constitute an oscillation amplifier circuit. Wherein, the capacitor module 100, the first microwave resonant cavity 200 and the superconducting quantum interference apparatus 300 are connected in sequence, and the inductance-adjustable superconducting quantum interference apparatus 300 is grounded; inductance of the superconducting quantum interference apparatus 300 is adjusted to make a resonant frequency of the first microwave resonant cavity 200 equal to a frequency of a signal to be amplified, so that the signal to be amplified has an optimal resonant amplification effect in the first microwave resonant cavity 200. The signal to be amplified is coupled into the oscillation amplifier circuit from the capacitor module 100, and the signal to be amplified and a pump signal perform nonlinear interaction in the first microwave resonant cavity 200, to further amplify the signal to be amplified. It should be noted that, the pump signal is also coupled into the oscillation amplifier circuit from the capacitor module 100. After the signal to be amplified and the pump signal perform nonlinear interaction, output signals not only include an amplified signal, but also include various idle frequency signals, that is, the oscillation amplifier circuit amplifies the signal to be amplified under an action of the pump signal and generates several types of idle frequency signals.

It should be noted that, according to a nonlinear mixing principle, each type of the idle frequency signals $f_i$ satisfies a formula below:

$$mf_s + nf_i = lf_p$$

Where m, n, and l are positive integers, $f_s$ is the frequency of the signal to be amplified, $f_p$ is the frequency of the pump signal, $f_i$ is the frequency of the idle frequency signal; when the signal to be amplified and the pump signal are determined, different values are taken for m, n and l, and various idle frequency signals will be obtained.

The quantum parameter amplifier according to this embodiment further includes a voltage modulating circuit 400; the voltage modulating circuit 400 is connected between the first microwave resonant cavity 200 and the superconducting quantum interference apparatus 300, and is configured to supply a bias voltage to the inductance-adjustable superconducting quantum interference apparatus 300; and the inductance-adjustable superconducting quantum interference apparatus 300, under an action of the bias voltage supplied by the voltage modulating circuit 400, release at least one type of the idle frequency signals generated in the oscillation amplifier circuit.

An operating principle is as follows: when the bias voltage is applied across the superconducting quantum interference apparatus 300, a current passing through the Josephson junction is an alternating oscillating superconducting current, whose oscillating frequency (or referred to as a Josephson frequency) f will be proportional to the bias voltage V, so that the Josephson junction has an ability to radiate or absorb electromagnetic waves, which satisfies a relational expression below:

$$2\,eV = hf$$

Where h is Planck's constant, and e is an electronic charge.

Since the superconducting quantum interference apparatus constituted by several Josephson junctions connected in parallel has the ability to absorb electromagnetic waves, when the bias voltage is applied to the inductance-adjustable superconducting quantum interference apparatus 300, a current Cooper pair on the Josephson junction will absorb energy of a microwave signal to tunnel through the Josephson junction and flow out into the ground; when an appropriate bias voltage is selected to make f in the relational expression $2\,eV = hf$ equal to a frequency of one type of the idle frequency signals generated by the oscillation amplifier circuit, the idle frequency signal generated in the oscillation amplifier circuit will be completely absorbed, which is manifested as the idle frequency signal being released.

The microwave resonant cavity can operate only by being connected with an external circuit to form a microwave system; oscillation can be established in the cavity only through excitation by a microwave signal in the external circuit; the oscillation in the cavity can be output to an external load only through coupling; and the coupling is usually established by using a capacitor module with the microwave resonant cavity. The number and positions of capacitor modules provided are related to a type of the microwave resonant cavity. In this embodiment, the microwave resonant cavity, that is, the first resonant cavity 200, is a transmissive microwave resonant cavity; and the transmissive microwave resonant cavity is a coplanar waveguide microwave resonant cavity whose length is half the wavelength of the signal to be amplified. Locations with strongest electric field intensity distribution of the coplanar waveguide microwave resonant cavity whose length is half the wavelength of the signal to be amplified may be set to be located at both ends of the coplanar waveguide microwave resonant cavity, and an electric field in a middle position is almost 0. In this embodiment, in order that each location with strongest electric field distribution is coupled to the outside, a capacitor module needs to be provided at each of such locations; that is, as shown in FIG. 7 and FIG. 8, both ends of the first microwave resonant cavity 200 are each provided with a capacitor module, namely, the capacitor module 100 and a second capacitor module 800.

And for convenience of description, the two ends of the first microwave resonant cavity 200 are recorded as one end connected with the capacitor module 100 and the other end away from the capacitor module 100; the location with strongest electric field intensity distribution that is connected with the capacitor module 100 is named a first location with strongest electric field intensity distribution, and the location with strongest electric field intensity distribution that is away from the capacitor module 100 is named a second location with strongest electric field intensity distribution. The first location with strongest electric field intensity distribution is set as a signal coupling input end, and the second location with strongest electric field intensity distribution as a signal coupling output end, then the capacitor module 100 is configured to couple the signal to be amplified into the first resonant cavity 200, that is, the second capacitor module 800 is configured to couple out the amplified signal from the first resonant cavity 200; and one end of the second capacitor module 800 that is away from the transmissive microwave resonant cavity may also be recorded as an output end of the oscillation amplifier circuit. In this embodiment, the capacitor module 100 and the second capacitor module 800 may both be selected from an inter-digital capacitor, a distributed capacitor or a parallel capacitor, and specific forms of the two will not be limited in the present disclosure.

In addition, when the end of the second capacitor module 800 that is away from the transmissive microwave resonant cavity is the output end of the oscillation amplifier circuit, the wave filter 600 may be provided at the output end of the oscillation amplifier circuit, as shown in FIG. 8, to satisfy filtering requirements of the output amplified signal.

In this embodiment, when the first microwave resonant cavity 200 is a transmissive microwave resonant cavity, the voltage modulating circuit 400 connected between the first microwave resonant cavity 200 and the superconducting quantum interference apparatus 300 is connected at the location with a weakest electric field of the transmissive microwave resonant cavity, where a direct-current bias voltage is introduced, which will not affect the microwave in the transmissive microwave resonant cavity. The signal to be amplified enters the transmissive microwave resonant cavity from the first location with strongest electric field intensity distribution, and is output from the second location with strongest electric field intensity distribution; and the input signal to be amplified and the output signal are isolated. Different from amplification of the signal to be amplified at the location with a strongest electric field by using a quarter-wavelength reflective resonant cavity, by using a half-wavelength coplanar waveguide microwave resonant cavity, the signal to be amplified will be amplified at a location with weakest signal absorption in the transmissive resonant cavity, thereby increasing a signal amplification gain.

In addition, when specifically implemented, the transmissive microwave resonant cavity may be formed by a pair of coplanar waveguide microwave resonant cavities 210 connected in series whose length is a quarter of the wavelength of the signal to be amplified. As compared with the quarter-wavelength structure, the half-wavelength structure may additionally ensure that the signal to be amplified may leave from the other port of the coplanar waveguide microwave resonant cavity, so it is not necessary to apply an additional circulator at the port to separate the signal to be amplified and the amplified signal with opposite propagation directions. Wherein, the voltage modulating circuit 400 is connected in series with the pair of coplanar waveguide microwave resonant cavities 210.

It should be noted that, the coplanar waveguide according to this embodiment is the same as those according to the other embodiments as described above, and the magnetic flux modulating line for transmitting the bias current may also use a coplanar waveguide transmitting line. No details will be repeated here.

In the quantum parameter amplifier according to this embodiment, the inductance of the superconducting quantum interference apparatus 300 is adjusted to make an operating resonant frequency of the first microwave resonant cavity 200 consistent with the frequency of the signal to be amplified, so that the signal to be amplified has the optimal resonant amplification effect in the first microwave resonant cavity 200; the signal to be amplified and the pump signal are coupled into the first microwave resonant cavity 200; the signal to be amplified will be amplified under the action of the pump signal; it should be noted that, the output signals not only include the amplified signal, but also include the pump signal, a half-frequency pump signal, multiple-frequency pump signals, and various idle frequency signals. At this time, when an appropriate bias voltage V is applied to make a relevant physical quantity satisfy the relational expression 2 eV=hf, where f is equal to a frequency of a certain type of idle frequency signal, the idle frequency signal generated in the oscillation amplifier circuit will be completely absorbed, so that the pump signal frequency $f_p$ that makes the quantum parameter amplifier in the optimal operation mode does not need to be selected as a multiple of the signal to be amplified. When the selected pump signal frequency has a frequency difference divisible by the wave filter from the frequency of the signal to be amplified, each type of the idle frequency signals output also has a frequency difference divisible by the wave filter from the signal to be amplified.

It should be noted that, before operation of the quantum parameter amplifier according to this embodiment, various parameters need to be designed, including selecting a magnitude of the bias voltage and the frequency of the pump signal; one of ultimate objectives of the present disclosure is that none of the idle frequency signals in the output irrelevant signals will cause interference to the signal to be amplified, that is, to make them divisible by the wave filter; here a specific example is provided, when the frequency of the signal to be amplified is 4 GHz, firstly the frequency of one type of the idle frequency signals may be designed as 2 GHz, the bias voltage is calculated through the relational expression 2 eV=hf, and then one of possible pump signal frequencies is calculated according to the formula $mf_s+nf_i=lf_p$, for example, when m, n, and l are all 1, the pump signal frequency is selected as 6 GHz, at this time, other possible idle frequency signals are determined according to the frequency of the signal to be amplified, the pump signal frequency and the formula $mf_s+nf_i=lf_p$; it may be proved that, when different values are taken for m, n and l, none of the obtained idle frequency signals $f_i$ will cause interference to the signal $f_s$ to be amplified. Table 3 shows 8 types of idle frequency signals whose frequencies are closest to the frequency of the signal $f_s$ to be amplified when the frequency of the signal to be amplified is 4 GHz and the pump signal frequency is 6 GHz.

TABLE 3

| | 8 types of idle frequency signals | | | | | | | |
|---|---|---|---|---|---|---|---|---|
| m | 1 | 1 | 1 | 1 | −1 | −1 | −1 | −1 |
| l | 1 | 1 | −1 | −1 | 1 | 1 | −1 | −1 |
| n | 1 | −1 | 1 | −1 | 1 | −1 | 1 | −1 |
| $f_i$ | 2 GHz | 10 GHz | −10 Ghz | −2 GHz | −2 GHz | 10 GHz | −10 GHz | 2 GHz |

It can be seen from Table 3 that the generated 8 types of idle frequency signals $f_s$ whose frequencies are closest to the frequency of the signal $f_s$ to be amplified all maintain a certain frequency difference from the signal $f_s$ to be amplified, so other idle frequency signals $f_s$ generated thereby will not cause interference to the signal $f_s$ to be amplified.

The traditional quantum parameter amplifier also has another problem: when the actual quantum chip operates, a large number of quantum bit signals need be simultaneously read out; quantum state information of each quantum bit is carried out by an independent signal, and a frequency thereof is different from a frequency of a signal carrying quantum state information of other quantum bit. Simultaneously reading a plurality of quantum bits means that there are simultaneously a plurality of signals to be amplified carrying information, which need to pass through the quantum parameter amplifier. Each signal therein will generate a large number of irrelevant signals while getting the amplification effect, and at least one irrelevant signal therein is close to the signal to be amplified itself. Besides, an irrelevant signal generated by a certain signal to be amplified is likely to have a frequency additionally close to a frequency of another signal to be amplified.

Specifically, for example: frequencies of signals $f_s$ to be amplified input to the traditional quantum parameter amplifier are respectively 6.4 GHz and 6.58 GHz (with a distance of 0.18 GHz, which is divisible by the wave filter); the pump signal frequency $f_p$ of the traditional quantum parameter amplifier may be designed as 6.5 GHz, corresponding to the four-wave mixing mode; then according to the formula $mf_s+nf_i=lf_p$, the frequency of one of the idle frequency signals of the amplified signal whose frequency is 6.4 GHz is 6.6 GHz, which will affect the 6.58 GHz signal (with a distance of 0.02 GHz, which is hardly divisible).

When the quantum parameter amplifier according to the present disclosure is adopted, by designing an idle frequency signal as, for example, 4 GHz, and designing the pump signal $f_p$ as 5.2 GHz and a bias voltage according to the 4 GHz signal and the 6.4 GHz amplified signal $f_s$, it can be known that, according to signal mixing effects of the 5.2 GHz pump signal $f_p$ respectively with the amplified signals $f_s$ of 6.4 GHz and 6.58 GHz, all the idle frequency signals $f_i$ obtained maintain a divisible frequency difference from the amplified signals $f_s$ of 6.4 GHz and 6.58 GHz.

In summary, as compared with the prior art, the operation mode of the quantum parameter amplifier according to this embodiment is no longer adjusted by only the pump signal, but is adjusted by the bias voltage supplied by the voltage modulating circuit 400 and the pump signal together; when the appropriate bias voltage and pump signal are selected, every type of irrelevant signals generated in the quantum parameter amplifier may maintain a frequency difference divisible by the wave filter from the signal to be amplified on a frequency spectrum, which may further eliminate these irrelevant signals, and improve fidelity of the quantum parameter amplifier for reading the quantum bit read signal.

Wherein, the inductance-adjustable superconducting quantum interference apparatus 300 according to this embodiment includes a superconducting quantum interferometer 310 and a magnetic flux modulating circuit 320 coupled by mutual inductance; the superconducting quantum interferometer 310 is a closed-loop apparatus constituted by Josephson junctions connected in parallel; and the magnetic flux modulating circuit 320 is configured to adjust magnetic flux of the closed-loop apparatus, to adjust inductance of the closed-loop apparatus, and further adjust the inductance of the superconducting quantum interferometer 310. Wherein, the superconducting quantum interferometer 310 is connected with the first microwave resonant cavity 200; and the magnetic flux modulating circuit 320 and the superconducting quantum interferometer 310 are coupled by mutual inductance. Specifically, the superconducting quantum interferometer 310 used in this embodiment may be a closed-loop apparatus constituted by 2 Josephson junctions connected in parallel, and the number of Josephson junctions will not be limited in the present disclosure.

It should be noted that, the pump signal for amplifying the signal to be amplified may also be coupled into the oscillation amplifier circuit from the magnetic flux modulating circuit 320.

Wherein, the magnetic flux modulating circuit 320 includes a magnetic flux modulating line and a current apparatus connected in sequence; the current apparatus is configured to generate a bias current; the magnetic flux modulating line is configured to transmit the bias current; and the bias current is used to adjust the inductance of the superconducting quantum interferometer 310. Specifically, bias currents of different magnitudes generate magnetic fields of different magnitudes, so the magnetic flux passing through the superconducting quantum interferometer will also change with the magnitude of the bias current, the magnetic flux of the superconducting quantum interferometer changes, and further the inductance of the superconducting quantum interferometer changes accordingly.

It should be noted that, the current apparatus for generating the bias current may be a current source, or a voltage source and a resistor connected in sequence that may supply the bias current; and a specific form of the current source will not be limited in the present disclosure.

Specifically, in order to filter out the irrelevant signals other than the amplified signal in the output signals, the quantum parameter amplifier is further provided with a wave filter 600 at an output end of the oscillation amplifier circuit. Wherein, the irrelevant signals mainly refer to the pump signal, the half-frequency pump signal, multiple-frequency pump signals, and various idle frequency signals.

It should be noted that, the coplanar waveguide according to this embodiment is the same as those according to the other embodiments as described above, the magnetic flux modulating line for transmitting the bias current may also use a coplanar waveguide transmitting line, and no details will be repeated here.

Although the present disclosure is explained in detail with reference to the foregoing embodiments, those ordinarily skilled in the art will readily appreciate that many modifications are possible in the foregoing respective embodiments, or equivalent substitutions are made for part of technical features; however, these modifications or substitutions are not intended to make the essences of the corresponding technical solutions depart from the spirit and the scope of the technical solutions of the respective embodiments of the present disclosure.

What is claimed is:

1. A quantum parameter amplifier, comprising a capacitor module a first microwave resonant cavity, and an inductance-adjustable superconducting quantum interference apparatus that are connected in sequence to constitute an oscillation amplifier circuit; wherein the superconducting quantum interference apparatus is grounded; a signal to be amplified is coupled into the oscillation amplifier circuit from the capacitor module, when a resonant frequency of the first microwave resonant cavity is equal to the frequency of the signal to be amplified; the oscillation amplifier circuit amplifies the signal to be amplified under an action of a pump signal and generates idle frequency signals; and inductance of the superconducting quantum interference apparatus is adjusted to make the resonant frequency of the first microwave resonant cavity equal to the frequency of the signal to be amplified, the quantum parameter amplifier further comprises a voltage modulating circuit and/or a second microwave resonant cavity, one end of the voltage modulating circuit is connected with an end of the superconducting quantum interference apparatus that is close to the first microwave resonant cavity; the voltage modulating circuit is configured to supply a bias voltage to the superconducting quantum interference apparatus; and the superconducting quantum interference apparatus, under an action of the bias voltage, releases at least one type of the idle frequency signals generated in the oscillation amplifier circuit;

one end of the second microwave resonant cavity is connected with the end of the superconducting quantum interference apparatus that is close to the first microwave resonant cavity; and a resonant frequency of the second microwave resonant cavity is equal to a frequency of one type of the idle frequency signals generated by the oscillation amplifier circuit.

2. The quantum parameter amplifier according to claim 1, wherein the superconducting quantum interference apparatus includes a superconducting quantum interferometer and a magnetic flux modulating circuit coupled by mutual inductance;

the superconducting quantum interferometer is a closed-loop apparatus constituted by Josephson junctions connected in parallel; and the magnetic flux modulating circuit is configured to adjust inductance of the closed-loop apparatus.

3. The quantum parameter amplifier according to claim 2, wherein the magnetic flux modulating circuit includes a magnetic flux modulating line and a current apparatus connected in sequence;

the current apparatus is configured to generate a bias current;

the magnetic flux modulating line is configured to transmit the bias current; and the bias current is used to adjust the inductance of the superconducting quantum interferometer.

4. The quantum parameter amplifier according to claim 3, wherein the magnetic flux modulating line is a coplanar waveguide transmitting line.

5. The quantum parameter amplifier according to claim 3, wherein the current apparatus is a current source, or a voltage source and a resistor connected in sequence that is configured to supply the bias current.

6. The quantum parameter amplifier according to claim 2 any one of claims 2 to 5, wherein the superconducting quantum interferometer is a closed-loop apparatus constituted by two Josephson junctions connected in parallel.

7. The quantum parameter amplifier according to claim 2, wherein the pump signal is coupled into the oscillation amplifier circuit from the capacitor module and/or the magnetic flux modulating circuit.

8. The quantum parameter amplifier according to claim 1, wherein the capacitor module is any one of an interdigital capacitor, a distributed capacitor and a parallel capacitor.

9. The quantum parameter amplifier according to claim 1, wherein the quantum parameter amplifier further comprises a wave filter, the wave filter is connected with an output end of the oscillation amplifier circuit.

10. The quantum parameter amplifier according to claim 1, wherein the first microwave resonant cavity is a reflective microwave resonant cavity; and the superconducting quantum interference apparatus is connected with an electric field intensity distribution wave node of the reflective microwave resonant cavity.

11. The quantum parameter amplifier according to claim 10, wherein the reflective microwave resonant cavity is a coplanar waveguide microwave resonant cavity; and the length of the coplanar waveguide microwave resonant cavity is $(2k+1)/4$ of the wavelength of the signal to be amplified, where $k \geq 0$ and k is an integer.

12. The quantum parameter amplifier according to claim 10, wherein the quantum parameter amplifier further comprises a circulator;

the circulator is connected with an end of the capacitor module that is away from the reflective microwave resonant cavity, and is configured to input the signal to be amplified into the oscillation amplifier circuit, and output an amplified signal generated by the oscillation amplifier circuit.

13. The quantum parameter amplifier according to claim 1, wherein the first microwave resonant cavity is a transmissive microwave resonant cavity; and the inductance-adjustable superconducting quantum interference apparatus is connected with an electric field intensity distribution wave node of the transmissive microwave resonant cavity.

14. The quantum parameter amplifier according to claim 13, wherein the transmissive microwave resonant cavity is a coplanar waveguide microwave resonant cavity; and the length of the coplanar waveguide microwave resonant cavity is half the wavelength of the signal to be amplified.

15. The quantum parameter amplifier according to claim 13, wherein the transmissive microwave resonant cavity is constituted in series by a pair of coplanar waveguide microwave resonant cavities whose length is a quarter of the wavelength of the signal to be amplified.

16. The quantum parameter amplifier according to claim 13, wherein the quantum parameter amplifier further comprises a second capacitor module;

the second capacitor module is connected with an electric field intensity distribution wave loop of the transmissive microwave resonant cavity, and is configured to output an amplified signal generated by the oscillation amplifier circuit.

17. The quantum parameter amplifier according to claim 1, wherein the second microwave resonant cavity is grounded.

\* \* \* \* \*